United States Patent
Zhang et al.

(10) Patent No.: US 12,286,701 B2
(45) Date of Patent: Apr. 29, 2025

(54) PREPARATION METHOD FOR TUNGSTEN SULFIDE SOLID LUBRICATING FILM BASED ON HIGH POWER IMPULSE MAGNETRON SPUTTERING

(71) Applicants: Taizhou University, Taizhou (CN); Wenling Gonglian Measuring&Cutting Tool Technology Service Center Co., Ltd, Taizhou (CN); Wenling Research Institute of Taizhou University, Taizhou (CN)

(72) Inventors: Ping Zhang, Taizhou (CN); Puyou Ying, Taizhou (CN); Jianbo Wu, Taizhou (CN); Vladimir Levchenko, Taizhou (CN); Tao Yang, Taizhou (CN); Changhong Lin, Taizhou (CN); Jian Wu, Taizhou (CN)

(73) Assignees: Taizhou University, Taizhou (CN); Wenling Gonglian Measuring & Cutting Tool Technology Service Center Co., Ltd, Wenling (CN); Wenling Research Institute of Taizhou University, Wenling (CN)

(*) Notice: Subject to any disclaimer, the term of this patent is extended or adjusted under 35 U.S.C. 154(b) by 0 days.

(21) Appl. No.: 18/611,678

(22) Filed: Mar. 20, 2024

(65) Prior Publication Data
US 2025/0109478 A1  Apr. 3, 2025

(30) Foreign Application Priority Data
Sep. 28, 2023  (CN) .............................. 202311277314

(51) Int. Cl.
*C23C 14/06* (2006.01)
*C01G 41/00* (2006.01)
(Continued)

(52) U.S. Cl.
CPC .......... *C23C 14/0623* (2013.01); *C01G 41/00* (2013.01); *C10M 103/06* (2013.01);
(Continued)

(58) Field of Classification Search
None
See application file for complete search history.

(56) References Cited

U.S. PATENT DOCUMENTS

| 2003/0209422 A1* | 11/2003 | Wang | C23C 14/024 |
| | | | 204/192.12 |
| 2011/0160066 A1* | 6/2011 | Aytug | C23C 14/024 |
| | | | 204/192.15 |

FOREIGN PATENT DOCUMENTS

WO  WO-9704142 A1 *  2/1997  ............. C23C 14/02

* cited by examiner

*Primary Examiner* — Jason Berman

(57) ABSTRACT

A preparation method for a tungsten sulfide ($WS_2$) solid lubricating film based on high power impulse magnetron sputtering (HiPIMS) is provided. The preparation method includes the following steps: step 1: depositing a metal conductive film on a surface of a $WS_2$ target; step 2: using magnetic field sputtering to remove the metal conductive film in a target sputtering area on the surface of the $WS_2$ target, thereby obtaining a first $WS_2$ target; and step 3: performing the HiPIMS on the first $WS_2$ target to obtain the $WS_2$ solid lubricating film. The preparation method can achieve stable glow discharge of a $WS_2$ target and use the high deposition energy of HiPIMS to prepare the $WS_2$ solid lubricating film with high compactness and excellent wear resistance.

13 Claims, 3 Drawing Sheets

(51) Int. Cl.
*C10M 103/06* (2006.01)
*C10M 177/00* (2006.01)
*C23C 14/18* (2006.01)
*C23C 14/34* (2006.01)
*C23C 14/35* (2006.01)
*C10N 50/00* (2006.01)
*C10N 70/00* (2006.01)

(52) U.S. Cl.
CPC .......... C10M 177/00 (2013.01); C23C 14/185 (2013.01); C23C 14/3485 (2013.01); C23C 14/352 (2013.01); C10M 2201/0653 (2013.01); C10N 2050/023 (2020.05); C10N 2070/00 (2013.01)

PREPARATION METHOD FOR TUNGSTEN SULFIDE SOLID LUBRICATING FILM BASED ON HIGH POWER IMPULSE MAGNETRON SPUTTERING

TECHNICAL FIELD

The present disclosure relates to the technical field of solid lubricating films applied to a surface of a metal material, and particularly to a preparation method for a tungsten sulfide ($WS_2$) solid lubricating film based on high power impulse magnetron sputtering (HiPIMS).

BACKGROUND

When equipment is running, the friction between mechanical parts is a main reason which results in a large amount of energy consumption and short service lives of the mechanical parts. According to statistics, nearly 30% of energy of mechanical equipment is consumed through the friction, and 80% of mechanical equipment is scrapped due to wear of key moving parts. Therefore, it is very important to reduce friction coefficient and improve wear resistance of materials. In many special fields, such as aerospace, vacuum, food and medical equipment, oil lubrication is not suitable, and the development of solid lubricating materials is an effective solution. As transition metal dichalcogenides (TMDCs) having layered structures, $WS_2$-based films and molybdenum disulfide-based ($MoS_2$-based) films prepared by magnetron sputtering have good lubricating performance and stability, and are excellent solid lubricating materials. Among them, $WS_2$-based films have better thermal stability and oxidation resistance, and its wear resistance is better.

A pure $WS_2$ film has a loose and soft structure and poor wear resistance, making it easy to lose lubricating performance during friction. To solve these defects, modifications of the pure $WS_2$ film can be made by doping tantalum (Ta), aluminium (Al), copper (Cu), nickel (Ni), chromium (Cr), lanthanum (La), titanium (Ti), zirconium (Zr), etc. to increase compactness and hardness of the film, and improve its wear resistance. Research has shown that after doping, the composite film has a more compact structure and a smoother surface, and adhesion between the composite film and a substrate is stronger. The hardness, wear resistance, oxidation resistance, and humidity resistance of the composite film are also improved.

In addition, the compactness of the film can be improved by increasing deposition energy. Among them, HiPIMS is a novel magnetron sputtering technology with high ionization rate and strong deposition energy. A film prepared by HiPIMS has high compactness and good adhesion, which has attracted more attention. However, for high power pulse magnetron sputtering deposition, it is required that a target is conductive, otherwise it is difficult to occur glow discharge, and the film may not be able to be deposited. The $WS_2$ target is non-conductive, the pure $WS_2$ film is generally prepared using radio frequency magnetron sputtering and intermediate frequency magnetron sputtering. However, the pure $WS_2$ film has a loose and soft structure and poor wear resistance. Due to the poor conductivity of $WS_2$ target, it is not possible to directly utilize the high deposition energy of HiPIMS to prepare a $WS_2$ film with a compact structure.

SUMMARY

A purpose of the present disclosure is to provide a preparation method for a $WS_2$ solid lubricating film based on HiPIMS. The preparation method can achieve stable glow discharge of a $WS_2$ target and use the high deposition energy of HiPIMS to prepare the $WS_2$ solid lubricating film with high compactness and excellent wear resistance.

To solve the above purpose, the present disclosure can provide the following technical solution: a preparation method for a $WS_2$ solid lubricating film based on HiPIMS, including:
    step 1: depositing a metal conductive film on a surface of a $WS_2$ target;
    step 2: using magnetic field sputtering to remove the metal conductive film in a target sputtering area on the surface of the $WS_2$ target, thereby obtaining a first $WS_2$ target; and
    step 3: performing the HiPIMS on the first $WS_2$ target to obtain the $WS_2$ solid lubricating film.

In an embodiment, the step 1 further comprises: using magnetron sputtering technology to deposit the metal conductive film on the surface of the $WS_2$ target.

In an embodiment, the step 1 further includes:
    simultaneously installing a metal target and the $WS_2$ target on adjacent target seats in a vacuum chamber, with an angle between the surface of the $WS_2$ target and a surface of the metal target being less than 180 degrees;
    closing a chamber door of the vacuum chamber after installing the metal target and the $WS_2$ target, and performing vacuuming on the vacuum chamber; and
    introducing an argon gas into the vacuum chamber to adjust a gas pressure in the vacuum chamber, turning on a sputtering power for the metal target, and depositing the metal conductive film on the surface of the $WS_2$ target.

In an embodiment, after the turning on a sputtering power for the metal target, the preparation method further includes: setting a bias voltage for the $WS_2$ target.

In an embodiment, after performing the vacuuming, the gas pressure in the vacuum chamber is less than $6\times10^{-3}$ Pascals (Pa).

In an embodiment, a flow rate of the argon gas is in a range of 50 standard cubic centimeters per minute (sccm) to 300 sccm.

In an embodiment, the gas pressure obtained after introducing the argon gas into the vacuum chamber is in a range of 0.5 Pa to 2 Pa.

In an embodiment, the step 3 further includes: using magnetron sputtering technology to deposit a titanium (Ti) layer on a substrate, performing the HiPIMS on the first $WS_2$ target to deposit a $WS_2$ solid lubricating layer on the Ti layer, thereby obtaining the $WS_2$ solid lubricating film.

In an embodiment, the using magnetron sputtering technology to deposit a Ti layer on a substrate comprises: performing vacuuming on a vacuum chamber to keep a gas pressure in the vacuum chamber to be less than $6\times10^{-3}$ Pa, controlling a temperature in the vacuum chamber to be less than 300 Celsius degrees (° C.), introducing an argon gas into the vacuum chamber, controlling a flow rate of the argon gas to be in a range of 50 sccm to 300 sccm, controlling the gas pressure in the vacuum chamber to be in a range of 0.5 Pa to 2 Pa, and using the magnetron sputtering technology to deposit the Ti layer on the substrate.

In an embodiment, a thickness of the Ti layer is in a range of 50 nanometers (nm) to 200 nm.

The present disclosure has the following beneficial effects.

The present disclosure provides a preparation method for a $WS_2$ solid lubricating film based on HiPIMS. The preparation method can achieve stable glow discharge of a $WS_2$ target and use the high deposition energy of HiPIMS to prepare the $WS_2$ solid lubricating film with high compactness and excellent wear resistance.

DETAILED DESCRIPTION OF EMBODIMENTS

Figure 1:
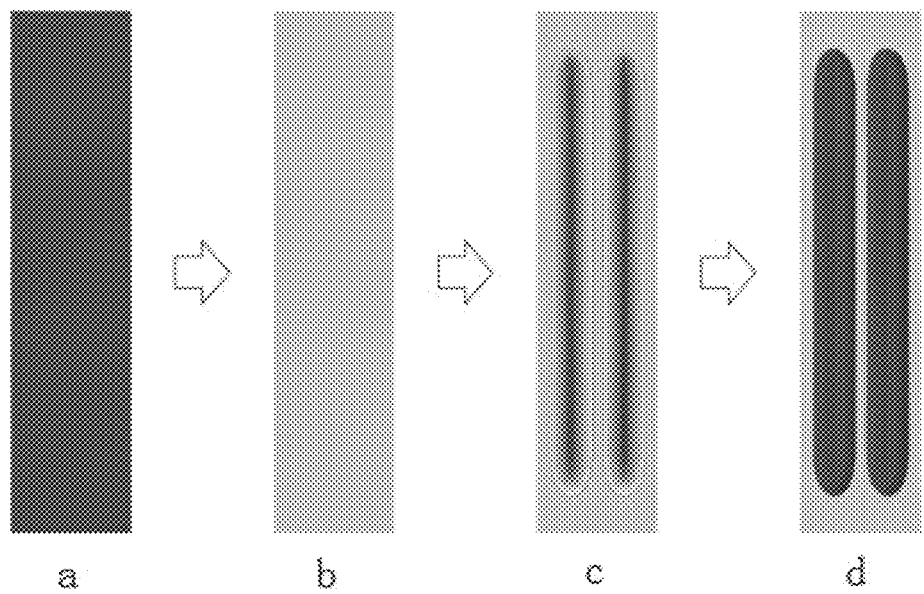
FIG. 1 illustrates a schematic diagram of how to achieve stable glow discharge of HiPIMS sputter a $WS_2$ target. Specifically, a illustrates the $WS_2$ target on which a metal conductive film is not deposited, b illustrates the $WS_2$ target on which the metal conductive film is deposited, c illustrates the $WS_2$ target on which a part of the metal conductive film is removed by magnetic field sputtering, and d illustrates the $WS_2$ target with a stable surface.

The present disclosure provides a preparation method for a tungsten sulfide ($WS_2$) solid lubricating film based on high power impulse magnetron sputtering (HiPIMS). The preparation method includes the following steps 1-3.

In step 1, a titanium (Ti) target and a $WS_2$ target are installed on adjacent target seats in a vacuum chamber, and an angle between a surface of the $WS_2$ target and a surface of the metal target (i.e., the Ti target) is adjusted to be less than 180 degrees. After installing the metal target and the $WS_2$ target on the adjacent target seats, a chamber door of the vacuum chamber is closed to perform vacuuming, thereby controlling a gas pressure in the vacuum chamber to be less than $6\times10^{-3}$ Pascals (Pa). Then an argon gas is introduced into the vacuum chamber, and a flow rate of the argon gas is in a range of 50 standard cubic centimeters per minute (sccm) to 300 sccm. An HiPIMS power source for the $WS_2$ target is turned on, and parameters of the HiPIMS power source for the $WS_2$ target are set to 1000 volts (V), 25 amperes (A), 1 kilowatt (kW), 1000 hertz (Hz), and 300 microseconds (μs). After turning on the HiPIMS power source for the $WS_2$ target, it can be found that an actual voltage of the $WS_2$ target is close to 1000 V while the current of the $WS_2$ target is less than 1 A, and glow discharge of the $WS_2$ target cannot be achieved due to poor conductivity of the $WS_2$ target. A measured resistance between the surface of the $WS_2$ target and the copper plate is in a range of 10 kiloohms (kΩ) to 50 kΩ. Then an HiPIMS power source for the metal target is turned on, parameters of the HiPIMS power source for the metal target are set to 1000 V, 25 A, 1 KW, 1000 Hz, and 100 μs; the HiPIMS power source for the $WS_2$ target is turned on again while the HiPIMS power source for the metal target is turned on, and the parameters of the HiPIMS power source for the $WS_2$ target are set to 200-300 V, 10 A, 0.5 kW, 1000 Hz, and 300 μs; at this moment, the glow discharge of the metal target will be achieved normally, but the $WS_2$ target cannot achieve glow discharge; the bias voltage in a range of 200-300 V is applied to the $WS_2$ target, and a metal conductive film will be deposited on the surface of the $WS_2$ target after 1 hour of deposition.

In step 2, the HiPIMS power source for the metal target and the HiPIMS power source for the $WS_2$ target are turned off, and the parameters of the HiPIMS power source for the $WS_2$ target are reset to 700 V, 10 A, 1 KW, 1000 Hz, and 300 μs. The HiPIMS power source for the $WS_2$ target is turned on again, at the same time, an actual voltage of the $WS_2$ target is in a range of 600-700 V while the current of the $WS_2$ target is in a range of 4-7 A, and the glow discharge of the $WS_2$ target can be achieved due to the metal conductive film on the surface of the $WS_2$ target. A measured resistance between the surface of the $WS_2$ target and the copper plate is in a range of 50 ohms (Ω) to 400Ω. Under the action of a magnetic field, the glow on the surface of the $WS_2$ target is used to sputter off a part of the metal conductive film on the surface of the $WS_2$ target, thereby exposing a part of the $WS_2$ target. Another part of the metal conductive film is remained on the surface of the $WS_2$ target, which provides a guarantee for the stable glow discharge of the $WS_2$ target.

In step 3, after finishing the step 1 and step 2, HiPIMS is used to prepare the $WS_2$ solid lubricating film with a compact structure and good wear resistance on a substrate. Specifically, the step 3 includes step 3.1, step 3.2, step 3.3, step 3.4, and step 3.5.

In step 3.1, stainless steel is taken as a material of the substrate. Firstly, the substrate is placed in acetone for 20 minutes of ultrasonic cleaning, and then the substrate is placed in alcohol for 20 minutes of ultrasonic cleaning, thereby removing stains on the surface of the substrate. Then the substrate is installed on a sample rack after drying the substrate.

In step 3.2, the sample rack installed with the substrate is placed in a vacuum chamber, and a chamber door of the vacuum chamber is closed to performing vacuuming. A gas pressure in the vacuum chamber is less than $6\times10^{-3}$ Pa after performing the vacuuming, and a temperature in the vacuum chamber is maintained at 100 Celsius degrees (° C.) by heating.

In step 3.3, an argon gas with a flow rate of 300 standard cubic centimeters per minute (sccm) is introduced into the vacuum chamber to maintain the gas pressure at about 0.8 Pa. A bias power supply is turned on, parameters of the bias power supply are set to 100 V and 75 Hz. The HiPIMS power source for the Ti target is turned on, and a Ti layer with a thickness in a range of 50 nanometers (nm) to 200 nm is deposited on the substrate. Specifically, parameters of the HiPIMS power source for the Ti target are set to 25 A, 1 KW, 1000 Hz, and 100 μs.

In step 3.4, the HiPIMS power source for the $WS_2$ target is turned on, and the Ti layer is coated with the $WS_2$ solid lubricating film with a thickness about 3 μm. Specifically, parameters of the HiPIMS power source for the $WS_2$ target are set to 8 A, 1.5 KW, 1000 Hz, and 300 μs; and a bias voltage applied to the substrate is 50 V.

In step 3.5, after preparing the $WS_2$ solid lubricating film, the power source for the $WS_2$ target is turned off and the argon gas is cut off, and the sample rack is taken out when the temperature in the vacuum chamber is less than 60° C.

In order to better understand the present disclosure, the following embodiments will be used to further clarify the content of the present disclosure. However, the content of the present disclosure is not limited to the following embodiments.

Embodiment 1

The preparation method provided in the embodiment includes steps 1-3.

In step 1, a Ti target and a WS$_2$ target are installed on adjacent target seats in a vacuum chamber, and an angle between a surface of the WS$_2$ target and a surface of the metal target (i.e., the Ti target) is adjusted to be less than 180 degrees. After installing the metal target and the WS$_2$ target, a chamber door of the vacuum chamber is closed to perform vacuuming, thereby controlling a gas pressure in the vacuum chamber to be less than 6×10$^{-3}$ Pa. Then an argon gas is introduced into the vacuum chamber, and a flow rate of the argon gas is 300 sccm. An HiPIMS power source for the WS$_2$ target is turned on, and parameters of the HiPIMS power source for the WS$_2$ target are set to 1000 V, 25 A, 1 KW, 1000 Hz, and 300 μs. After turning on the HiPIMS power source for the WS$_2$ target, it can be found that an actual voltage of the WS$_2$ target is close to 1000 V while the current of the WS$_2$ target is less than 1 A, and glow discharge of the WS$_2$ target cannot be achieved due to poor conductivity of the WS$_2$ target. A measured resistance between a surface of the WS$_2$ target and the copper plate is in a range of 10 kΩ to 50 kΩ. Then an HiPIMS power source for the metal target is turned on, parameters of the HiPIMS power source for the metal target are set to 1000 V, 25 A, 1 KW, 1000 Hz, and 100 μs; the HiPIMS power source for the WS$_2$ target is turned on again while the HiPIMS power source for the metal target is turned on, and the parameters of the HiPIMS power source for the WS$_2$ target are set to 200-300 V, 10 A, 0.5 kW, 1000 Hz, and 300 μs; at this moment, the glow discharge of the metal target will be achieved normally, but the WS$_2$ target cannot achieve glow discharge; the bias voltage in a range of 200-300 V is applied to the WS$_2$ target, and a metal conductive film will be deposited on the surface of the WS$_2$ target due to 1 hour of deposition.

In step 2, the HiPIMS power source for the metal target and the HiPIMS power source for the WS$_2$ target are turned off, and the parameters of the HiPIMS power source for the WS$_2$ target are reset to 700 V, 10 A, 1 KW, 1000 Hz, and 300 μs. The HiPIMS power source for the WS$_2$ target is turned on again, at the same time, an actual voltage of the WS$_2$ target is in a range of 600-700 V while the current of the WS$_2$ target is in a range of 4-7 A, and the glow discharge of the WS$_2$ target can be achieved due to the metal conductive film on the surface of the WS$_2$ target. A measured resistance between the surface of the WS$_2$ target and the copper plate is in a range of 50Ω to 400Ω. Under the action of a magnetic field, the glow on the surface of the WS$_2$ target is used to sputter off a part of the metal conductive film on the surface of the WS$_2$ target, thereby exposing a part of the WS$_2$ target. Another part of the metal conductive film is remained on the surface of the WS$_2$ target.

In step 3, after finishing the step 1 and step 2, HiPIMS is used to prepare the WS$_2$ solid lubricating film with a compact structure and good wear resistance on a substrate. Specifically, the step 3 includes step 3.1, step 3.2, step 3.3, step 3.4, and step 3.5.

In step 3.1, stainless steel is taken as a material of the substrate. Firstly, the substrate is placed in acetone for 20 minutes of ultrasonic cleaning, and then the substrate is placed in alcohol for 20 minutes of ultrasonic cleaning, thereby removing stains on the surface of the substrate. The substrate is installed on a sample rack after drying the substrate.

In step 3.2, the sample rack installed with the substrate is placed in a vacuum chamber, and a chamber door of the vacuum chamber is closed to performing vacuuming. A gas pressure in the vacuum chamber is less than 6×10$^{-3}$ Pa after performing the vacuuming, and a temperature in the vacuum chamber is maintained at 100° C. by heating.

In step 3.3, an argon gas with a flow rate of 300 sccm is introduced into the vacuum chamber to maintain the gas pressure at about 0.8 Pa. A bias power supply is turned on, parameters of the bias power supply are set to 100 V and 75 Hz. The HiPIMS power source for the Ti target is turned on, and a Ti layer with a thickness in a range of 50 nanometers (nm) to 200 nm is deposited on the substrate. Specifically, parameters of the HiPIMS power source for the Ti target are set to 25 A, 1 KW, 1000 Hz, and 100 μs.

In step 3.4, the HiPIMS power source for the WS$_2$ target is turned on, and the Ti layer is coated with the WS$_2$ solid lubricating film with a thickness about 3 μm. Specifically, parameters of the HiPIMS power source for the WS$_2$ target are set to 8 A, 1.5 kW, 1000 Hz, and 300 μs; and a bias voltage applied to the substrate is 50 V.

In step 3.5, after preparing the WS$_2$ solid lubricating film, the HiPIMS power source for the WS$_2$ target is turned off and the argon gas is cut off, and the sample rack is taken out when the temperature in the vacuum chamber is less than 60° C.

Comparative Embodiment 1

In the embodiment, a preparation method for a pure WS$_2$ film using radio frequency magnetron sputtering technology is provided. The preparation method includes steps 1-5.

In step 1, stainless steel is taken as a material of the substrate. Firstly, the substrate is placed in acetone for 20 minutes of ultrasonic cleaning, and then the substrate is placed in alcohol for 20 minutes of ultrasonic cleaning, thereby removing stains on a surface of the substrate. The substrate is installed on a sample rack after drying the substrate.

In step 2, the sample rack installed with the substrate is placed in a vacuum chamber, and a chamber door of the vacuum chamber is closed to performing vacuuming. A gas pressure in the vacuum chamber is less than 5×10$^{-3}$ after performing the vacuuming, and a temperature in the vacuum chamber is maintained at 100° C. by heating.

In step 3, an argon gas is introduced into the vacuum chamber, and the gas pressure in the vacuum chamber can be maintained at 0.8 Pa. A bias voltage is set to 100 V, a power source for a Ti target is turned on, power of the power source for the Ti target is set to 120 W, and a Ti transition layer with a thickness about 200 nm is deposited on the substrate by direct current (DC) magnetron sputtering.

In step 4, the power source for the Ti target is turned off, a power source for a WS$_2$ target is turned on, power of the power source for the WS$_2$ target is set to 100 W, and the pure WS$_2$ film with a thickness about 3 μm is deposited by radio frequency magnetron sputtering.

In step 5, after preparing the pure WS$_2$ film, the power source for the WS$_2$ target is turned off, the argon gas is cut off, and the sample rack is taken out when the temperature in the vacuum chamber is less than 60° C.

Figure 2:
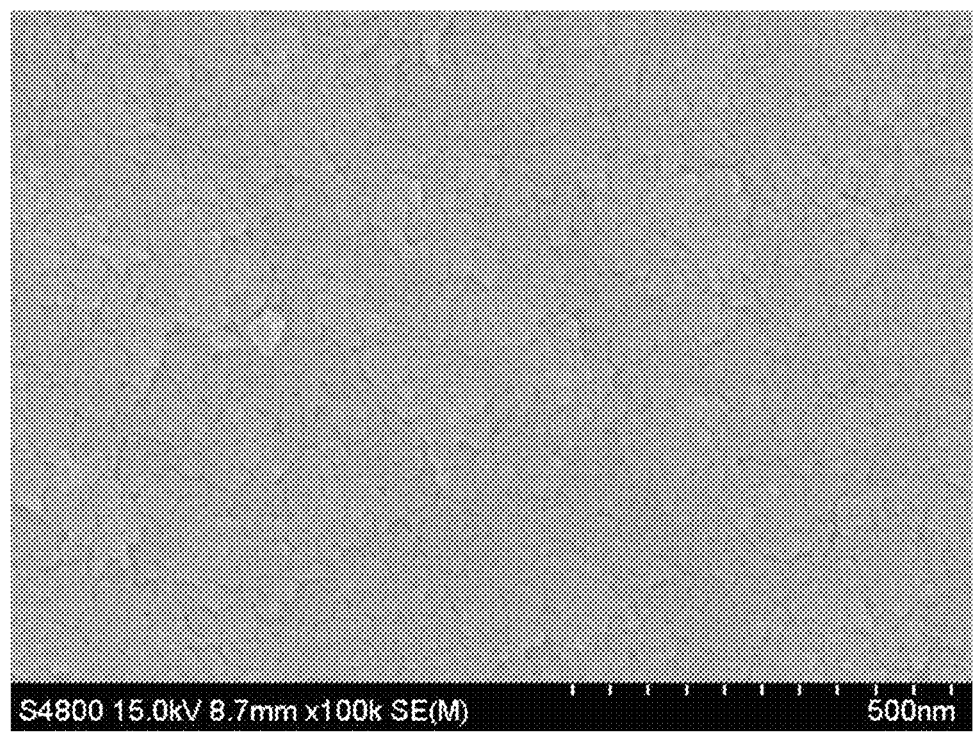
FIG. 2 illustrates a surface morphology of a sample (i.e., the $WS_2$ solid lubricating film) obtained from an embodiment 1 of the present disclosure.
Figure 3:
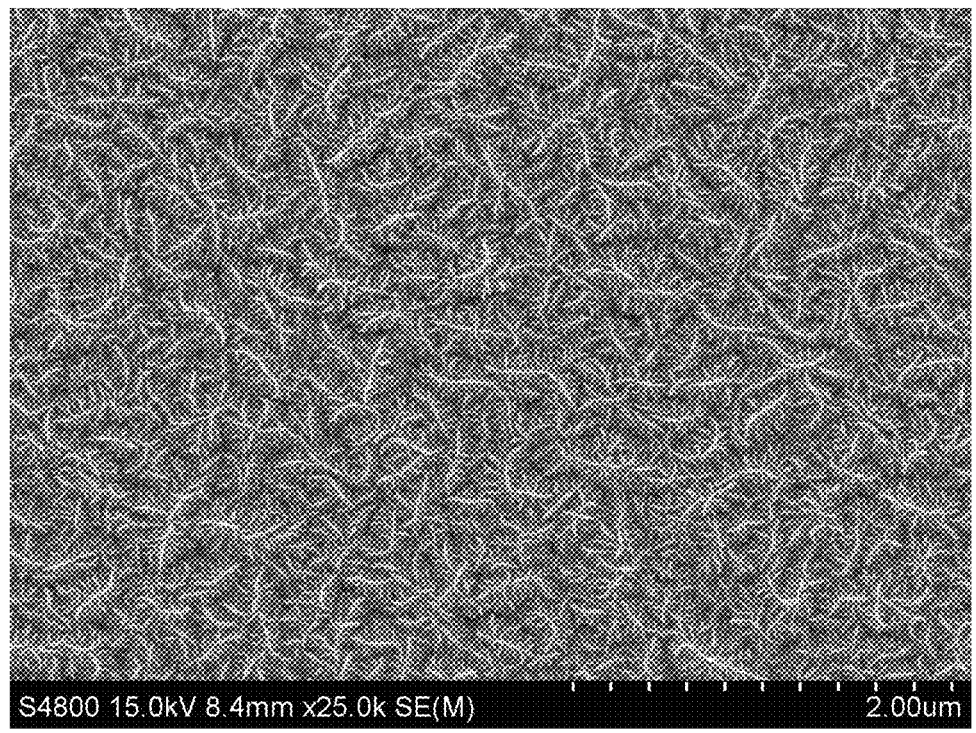
FIG. 3 illustrates a surface morphology of a sample obtained from a comparative embodiment 1 of the present disclosure.

As shown in FIG. 2 and FIG. 3, a scanning electron microscope is used to observe a surface morphology of the WS$_2$ solid lubricating film obtained from the embodiment 1 and a surface morphology of the pure WS$_2$ film obtained from the comparative embodiment 1. The surface morphology of the pure WS$_2$ film prepared by radio frequency magnetron sputtering is similar to fir leaves, and the pure WS$_2$ film has an uneven surface, a loose structure, and a poor compactness. The surface morphology of the WS$_2$ solid lubricating film prepared by HiPIMS is scaly. The WS$_2$ solid lubricating film has a flat surface, a compact structure, and a good compactness. Grains of the WS$_2$ solid lubricating film are refined and more uniform. The compact structure increases the hardness of the $WS_2$ solid lubricating film from 0.21 gigapascals (GPa) to 4.5 GPa.

Figure 4:
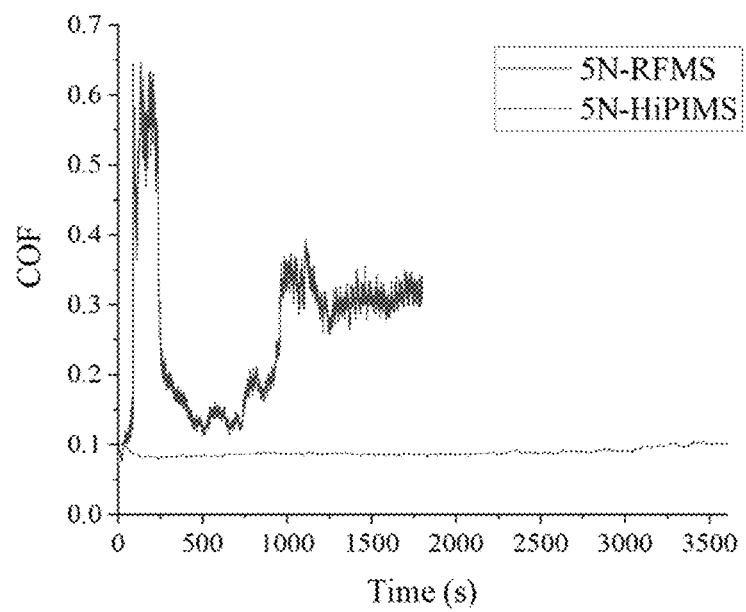
FIG. 4 illustrates a friction coefficient diagram of the samples obtained from the embodiment 1 and the comparative embodiment 1.

FIG. 4 illustrates a friction coefficient diagram of the $WS_2$ solid lubricating film obtained from the embodiment 1 and the pure $WS_2$ film obtained from the comparative embodiment 1. The friction coefficient diagram shows test results of friction tests for the $WS_2$ solid lubricating film and the pure $WS_2$ film under 5 newtons (N) load and 1 Hz friction frequency. Test time for the $WS_2$ solid lubricating film is 1 hour, and test time for the pure $WS_2$ is 0.5 hour. A GCr15 (a type of high-carbon chromium bearing steel) steel ball with a diameter of 10 mm is used to perform a friction test on the $WS_2$ solid lubricating film, and a scratch length of 5 mm is used in the friction test. Another GCr15 steel ball with a diameter of 10 mm is used to perform another friction test on the pure $WS_2$ film, and a scratch length of 5 mm is used in the friction test.

It can be seen from the test results that the friction coefficient of the pure $WS_2$ film quickly reaches about 0.55, which may be related to a fact that the hardness of the pure $WS_2$ film is too low. The pure $WS_2$ film is damaged at the beginning under the 5 N load, which hinders friction and causes a sudden increase in the friction coefficient. Then the pure $WS_2$ film forms a friction film, and the friction coefficient is decreased to below 0.2. However, when the friction test is performed for about 1000 s, the friction coefficient increases and finally stabilizes in a range of 0.3 to 0.4, and the friction film has been worn through at this time. For the $WS_2$ solid lubricating film prepared by HiPIMS, the friction coefficient of the $WS_2$ solid lubricating film is maintained below 0.1 in the test time of 1 hour, which exhibits excellent lubrication performance.

Figure 5:
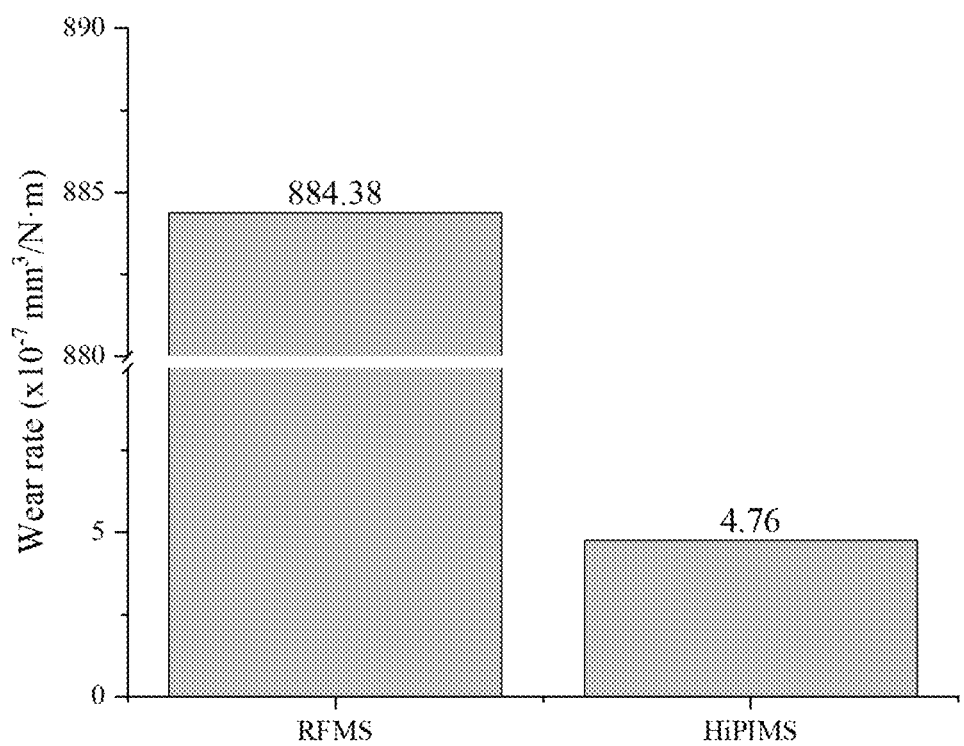
FIG. 5 illustrates a wear rate diagram of the samples obtained from the embodiment 1 and the comparative embodiment 1.

FIG. 5 illustrates a wear rate diagram of the $WS_2$ solid lubricating film obtained from the embodiment 1 and the pure $WS_2$ film obtained from the comparative embodiment 1. From the wear rate diagram, it can be seen that the wear rate of the pure $WS_2$ film reaches $884.38 \times 10^{-7}$ mm$^3$/(N·m), while the wear rate of the $WS_2$ solid lubricating film is only $4.76 \times 10^{-7}$ mm$^3$/(N·m). The $WS_2$ solid lubricating film has better wear resistance than the pure $WS_2$ film.

The above is only an exemplary embodiment of the present disclosure. It should be pointed out that for those skilled in the art, improvements and modifications can be made without departing from principles of the present disclosure. These improvements and modifications should fall within the scope of protection of the present disclosure.

What is claimed is:

1. A preparation method for a tungsten sulfide ($WS_2$) solid lubricating film based on high power impulse magnetron sputtering (HiPIMS), comprising:
   step 1: depositing a metal conductive film on a surface of a $WS_2$ target by using a titanium (Ti) target;
   step 2: using magnetic field sputtering to remove a part of the metal conductive film on the surface of the $WS_2$ target, thereby obtaining a first $WS_2$ target, wherein a resting part of the metal conductive film is remained on the surface of the $WS_2$ target, and a part of the $WS_2$ target is exposed from a surface of the first $WS_2$ target; and
   step 3: depositing, through the Ti target, a Ti layer on a substrate by using magnetron sputtering technology, and performing the HiPIMS on the first $WS_2$ target to deposit a $WS_2$ solid lubricating layer on the Ti layer, thereby obtaining the $WS_2$ solid lubricating film.

2. The preparation method for the $WS_2$ solid lubricating film based on the HiPIMS as claimed in claim 1, wherein the step 1 further comprises: using the magnetron sputtering technology on the Ti target to deposit the metal conductive film on the surface of the $WS_2$ target.

3. The preparation method for the $WS_2$ solid lubricating film based on the HiPIMS as claimed in claim 1, wherein the step 1 further comprises:
   simultaneously installing the Ti target and the $WS_2$ target on adjacent target seats in a vacuum chamber, with an angle between the surface of the $WS_2$ target and a surface of the Ti target being less than 180 degrees;
   closing a chamber door of the vacuum chamber after installing the Ti target and the $WS_2$ target, and performing vacuuming on the vacuum chamber; and
   introducing an argon gas into the vacuum chamber to adjust a gas pressure in the vacuum chamber, turning on a sputtering power for the Ti target, and depositing the metal conductive film on the surface of the $WS_2$ target.

4. The preparation method for the $WS_2$ solid lubricating film based on the HiPIMS as claimed in claim 3, wherein after the turning on a sputtering power for the Ti target, the preparation method further comprises: setting a bias voltage for the $WS_2$ target.

5. The preparation method for the $WS_2$ solid lubricating film based on the HiPIMS as claimed in claim 3, wherein after performing the vacuuming, the gas pressure in the vacuum chamber is less than $6 \times 10^{-3}$ Pascals (Pa).

6. The preparation method for the $WS_2$ solid lubricating film based on the HiPIMS as claimed in claim 3, wherein a flow rate of the argon gas is in a range of 50 standard cubic centimeters per minute (sccm) to 300 sccm.

7. The preparation method for the $WS_2$ solid lubricating film based on the HiPIMS as claimed in claim 3, wherein the gas pressure obtained after introducing the argon gas into the vacuum chamber is in a range of 0.5 Pa to 2 Pa.

8. The preparation method for the $WS_2$ solid lubricating film based on the HiPIMS as claimed in claim 1, wherein the metal conductive film is a Ti film, and the substrate is stainless steel.

9. The preparation method for the $WS_2$ solid lubricating film based on the HiPIMS as claimed in claim 1, wherein the depositing, through the Ti target, a Ti layer on a substrate by using magnetron sputtering technology comprises: performing vacuuming on a vacuum chamber to keep a gas pressure in the vacuum chamber to be less than $6 \times 10^{-3}$ Pa, controlling a temperature in the vacuum chamber to be less than 300 Celsius degrees (° C.), introducing an argon gas into the vacuum chamber, controlling a flow rate of the argon gas to be in a range of 50 sccm to 300 sccm, controlling the gas pressure in the vacuum chamber to be in a range of 0.5 Pa to 2 Pa, and using the magnetron sputtering technology to deposit the Ti layer on the substrate.

10. The preparation method for the $WS_2$ solid lubricating film based on the HiPIMS as claimed in claim 1, wherein a thickness of the Ti layer is in a range of 50 nanometers (nm) to 200 nm.

11. A preparation method for a $WS_2$ solid lubricating film based on HiPIMS, comprising:
    step 1, installing a Ti target and a $WS_2$ target on adjacent target seats in a vacuum chamber, setting operation parameters of an HiPIMS power source for the Ti target, setting operation parameters of an HiPIMS power source for the $WS_2$ target, and turning on the HiPIMS power source for the Ti target and the HiPIMS power source for the $WS_2$ target to deposit a Ti film on a surface of the $WS_2$ target, wherein under the operation parameters of the HiPIMS power source for the Ti target and the operation parameters of an HiPIMS power source for the WS$_2$ target, glow discharge for the Ti target is achieved, and glow discharge for the WS$_2$ target is not achieved;

step 2, turning off the HiPIMS power source for the Ti target and the HiPIMS power source for the WS$_2$ target, resetting the operation parameters of the HiPIMS power source for the WS$_2$ target, and turning on the HiPIMS power source for the WS$_2$ target to remove a part of the Ti film from the surface of the WS$_2$ target and remain a resting part of the Ti film, wherein under the reset operation parameters of the HiPIMS power source for the WS$_2$ target, the glow discharge for the WS$_2$ target is achieved; and step 3, installing stainless steel in the vacuum chamber, turning on the HiPIMS power source for the Ti target to deposit a Ti layer on the stainless steel, and turning on the HiPIMS power source for the WS$_2$ target to perform the HiPIMS on the WS$_2$ target to deposit a WS$_2$ solid lubricating layer on the Ti layer, thereby obtaining the WS$_2$ solid lubricating film.

12. The preparation method for the WS$_2$ solid lubricating film based on the HiPIMS as claimed in claim 11, wherein the operation parameters of the HiPIMS power source for the Ti target comprise a voltage, a current, a power, a frequency, and a pulse width; and the operation parameters of the HiPIMS power source for the WS$_2$ target comprise a voltage, a current, a power, a frequency, and a pulse width; and wherein the resetting the operation parameters of the HiPIMS power source for the WS$_2$ target comprises: keeping the voltage and the power of the HiPIMS power source for the WS$_2$ target, and remaining the current, the frequency, and the pulse width of the HiPIMS power source for the WS$_2$ target unchanged.

13. The preparation method for the WS$_2$ solid lubricating film based on the HiPIMS as claimed in claim 11, wherein the resting part of the Ti film is configured to provide guarantee for stable glow discharge of the WS$_2$ target.

* * * * *